(12) United States Patent
Takizawa et al.

(10) Patent No.: US 12,439,620 B2
(45) Date of Patent: Oct. 7, 2025

(54) SEMICONDUCTOR DEVICE

(71) Applicant: DENSO CORPORATION, Kariya (JP)

(72) Inventors: Shin Takizawa, Kariya (JP); Yusuke Nonaka, Kariya (JP); Kenta Gouda, Kariya (JP); Shunsuke Harada, Kariya (JP)

(73) Assignee: DENSO CORPORATION, Kariya (JP)

( * ) Notice: Subject to any disclaimer, the term of this patent is extended or adjusted under 35 U.S.C. 154(b) by 427 days.

(21) Appl. No.: 18/172,426

(22) Filed: Feb. 22, 2023

(65) Prior Publication Data

US 2023/0197845 A1    Jun. 22, 2023

Related U.S. Application Data

(63) Continuation of application No. PCT/JP2021/030995, filed on Aug. 24, 2021.

(30) Foreign Application Priority Data

Aug. 26, 2020  (JP) ................. 2020-142628

(51) Int. Cl.
*H10D 12/01* (2025.01)
*H10D 30/66* (2025.01)
(Continued)

(52) U.S. Cl.
CPC ......... *H10D 12/038* (2025.01); *H10D 30/668* (2025.01); *H10D 30/669* (2025.01);
(Continued)

(58) Field of Classification Search
CPC .. H10D 12/031; H10D 12/038; H10D 12/481; H10D 48/031; H10D 30/0297; H10D 30/665; H10D 30/668; H10D 30/669; H10D 62/127; H10D 62/152; H10D 62/153; H10D 62/156; H10D 62/393; H10D 64/117; H10D 64/23; H10D 64/232;
(Continued)

(56) References Cited

U.S. PATENT DOCUMENTS

| 2010/0123187 A1* | 5/2010 | Burke ............... H10D 30/0295 257/330 |
| 2012/0146091 A1 | 6/2012 | Tanabe et al. |
| 2018/0240867 A1 | 8/2018 | Nitta et al. |

OTHER PUBLICATIONS

U.S. Appl. No. 18/172,498, filed Feb. 22, 2023, Gouda et al.

* cited by examiner

*Primary Examiner* — Cheung Lee
(74) *Attorney, Agent, or Firm* — Posz Law Group, PLC

(57) ABSTRACT

A semiconductor device includes a cell portion and a peripheral portion. The cell portion has a semiconductor element including a drift layer, a first impurity region, a second impurity region, trench-gate structures, a high-concentration layer, an interlayer insulating film, a first electrode and a second electrode. The interlayer insulating film is located on the trench-gate structures, the first impurity region and the second impurity region, and has a first contact hole communicating with the first impurity region and the second impurity region. The peripheral portion has a section facing the cell portion in one direction, and the interlayer insulating film further has a second contact hole at the section of the peripheral portion. The second contact hole exposes the first impurity region, and the first electrode is electrically connected to the first impurity region through the second contact hole in the peripheral portion.

4 Claims, 8 Drawing Sheets

(51) Int. Cl.
*H10D 62/10* (2025.01)
*H10D 62/13* (2025.01)
*H10D 62/17* (2025.01)
*H10D 64/00* (2025.01)

(52) U.S. Cl.
CPC ......... *H10D 62/127* (2025.01); *H10D 62/152* (2025.01); *H10D 62/393* (2025.01); *H10D 64/117* (2025.01)

(58) Field of Classification Search
CPC .. H10D 64/254; H10D 64/256; H10D 64/257; H10D 64/519
See application file for complete search history.

SEMICONDUCTOR DEVICE

CROSS REFERENCE TO RELATED APPLICATIONS

The present application is a continuation application of International Patent Application No. PCT/JP2021/030995 filed on Aug. 24, 2021, which designated the U.S. and claims the benefit of priority from Japanese Patent Application No. 2020-142628 filed on Aug. 26, 2020. The entire disclosures of all of the above applications are incorporated herein by reference.

TECHNICAL FIELD

The present disclosure relates to a semiconductor device.

BACKGROUND

A semiconductor device may have a cell portion and a peripheral portion, and may have a trench-gate structure with double gates in the cell portion. In such a semiconductor device, a semiconductor substrate may have an $n^-$ type drift layer on an $n^+$ drain layer.

SUMMARY

The present disclosure describes a semiconductor device including a peripheral portion and a cell portion having a semiconductor element.

DETAILED DESCRIPTION

Figure 1:
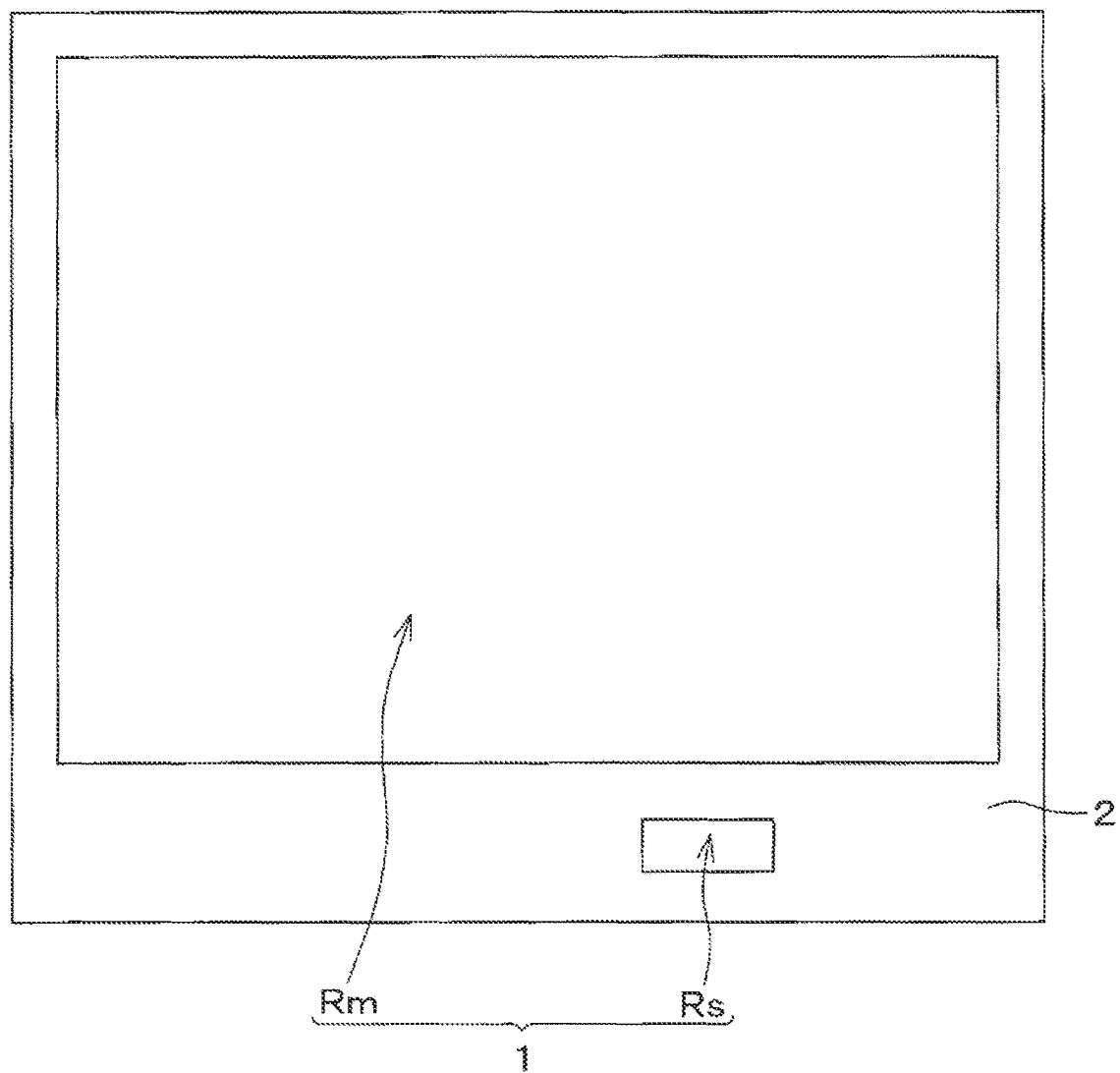
FIG. 1 is a schematic plan view of a semiconductor device according to a first embodiment.

In a semiconductor device, a body region and a source region may be formed at a surface layer portion of a semiconductor substrate. At the semiconductor substrate, a trench-gate structure may be formed to penetrate the body region and the source region and reach a drift layer. In the trench-gate structure of the semiconductor device, a shield electrode serving as a source potential may be arranged through a shield insulating film at a bottom side of a gate trench while a gate electrode may be arranged through a gate insulating film at an opening side of the gate trench. Therefore, it is possible to reduce a parasitic capacitance generated between the gate electrode and a drain electrode. An intermediate insulating film may be formed between the shield electrode and the gate electrode.

It may be desirable to have an enhanced breakdown voltage for a semiconductor device having a trench gate structure with double gates.

According to an aspect of the present disclosure, a semiconductor device includes a cell portion and a peripheral portion. The cell portion has the semiconductor element, and the peripheral portion surrounds the cell portion. The semiconductor element in the cell portion includes a drift layer, a first impurity region, a second impurity region, multiple trench-gate structures, a high-concentration layer, an interlayer insulating film, a first electrode and a second electrode. The drift layer is a first conductivity type. The first impurity region is located on the drift layer and is a second conductivity type. The second impurity region is located at a surface layer portion of the first impurity region inside the first impurity region. The second impurity region is the first conductivity type and has a higher impurity concentration than the drift layer. The trench-gate structures are arranged in a stripe shape. Each of the trench-gate structures includes a gate trench, a shield electrode, an intermediate insulating film, a gate electrode, and an insulating film. The gate trench has one direction as a longitudinal direction of the gate trench while penetrating the first impurity region from the second impurity region and reaching the drift layer. Each of the trench-gate structures has double gates configured by stacking the shield electrode, the intermediate insulating film and the gate electrode in order via the insulating film in the gate trench. The high-concentration layer is the first conductivity type or the second conductivity type. The high-concentration layer is located on a side opposite from the first impurity region with the drift layer sandwiched between the first impurity region and the high-concentration layer. The interlayer insulating film is located on each of the trench-gate structures, the first impurity region and the second impurity region. The interlayer insulating film has a first contact hole communicating with the first impurity region and the second impurity region. The first electrode is electrically connected to the first impurity region and the second impurity region through the first contact hole. The second electrode is electrically connected to the high-concentration layer. The first impurity region extends from the cell portion to the peripheral portion. The peripheral portion has a section facing the cell portion in the one direction, and the interlayer insulating film further has a second contact hole at the section of the peripheral portion. The second contact hole exposes the first impurity region, and the first electrode is electrically connected to the first impurity region through the second contact hole in the peripheral portion.

According to the above structure, the first impurity region extends to the peripheral portion, and the first electrode is electrically connected to the first impurity region at the peripheral portion. When the semiconductor device has an avalanche operation, carriers such as holes are likely to be extracted from the first electrode connected to the first impurity region. Therefore, it is possible to inhibit the operation of the parasitic bipolar transistor in the semiconductor device, and it is possible to enhance the breakdown voltage of the semiconductor device by enhancing the avalanche resistance.

Embodiments of the present disclosure will be described below with reference to the drawings. In the following embodiments, the same reference numerals are assigned to parts that are the same or equivalent to each other.

First Embodiment

A first embodiment will be described with reference to the drawings. The following describes a first embodiment. The present embodiment describes a semiconductor device as a semiconductor element including a vertical n-channel metal oxide semiconductor field effect transistor (MOSFET) having a trench-gate structure with double gates. The trench-gate structure with double gates may also be referred to as a dual-gate trench-gate structure or a double-gate trench-gate structure.

As illustrated in FIG. 1, the semiconductor device according to the present embodiment includes a cell portion 1 and a peripheral portion 2. The cell portion 1 has a main cell region Rm as a main cell and a sense cell region Rs as a sense cell. The main cell region Rm and the sense cell region Rs are provided with the MOSFETs with the identical structures, and are isolated from each other.

An area ratio is adjusted for the main cell region Rm and the sense cell region Rs such that the current flowing through the main cell is decreased by only a predetermined ratio to flow in the sense cell region Rs. Although not particularly limited, a size of the sense cell region Rs is a fraction of several hundreds to several tens of thousands of a size of the main cell region Rm. In the semiconductor device, since the flowing current is proportional to the area ratio, the current flowing to the main cell region Rm is detected based on the current flowing through the sense cell region Rs. The semiconductor device according to the present embodiment includes a source region 14. In the present embodiment, the cell portion 1 and the peripheral portion 2 are divided based on whether the source region 14 is formed. The cell portion 1 is a portion where the source region 14 is formed.

As illustrated in FIGS. 2 to 7, the following describes the structure of the semiconductor device such that a width direction of the MOSFET is defined as an x-direction, the depth direction of the MOSFET intersecting the x-direction is defined as a y-direction. The main cell region Rm and the sense cell region Rs in the cell portion 1 have the identical structures. Therefore, the structure of the cell portion 1 described in the following is applied to both of the main cell region Rm and the sense cell region Rs. The y-direction corresponds to one direction.

As shown in FIGS. 3 to 7, the semiconductor device according to the present embodiment is formed with the use of an $n^+$ type semiconductor substrate 10 having a substrate 11 made of a semiconductor material such as silicon having a relatively high impurity concentration. On the surface of the substrate 11, an $n^-$ type drift layer 12 having an impurity concentration lower than that of the substrate 11 is formed. In the present embodiment, the substrate 11 functions as a drain layer, and corresponds to a high-concentration layer.

Figure 2:
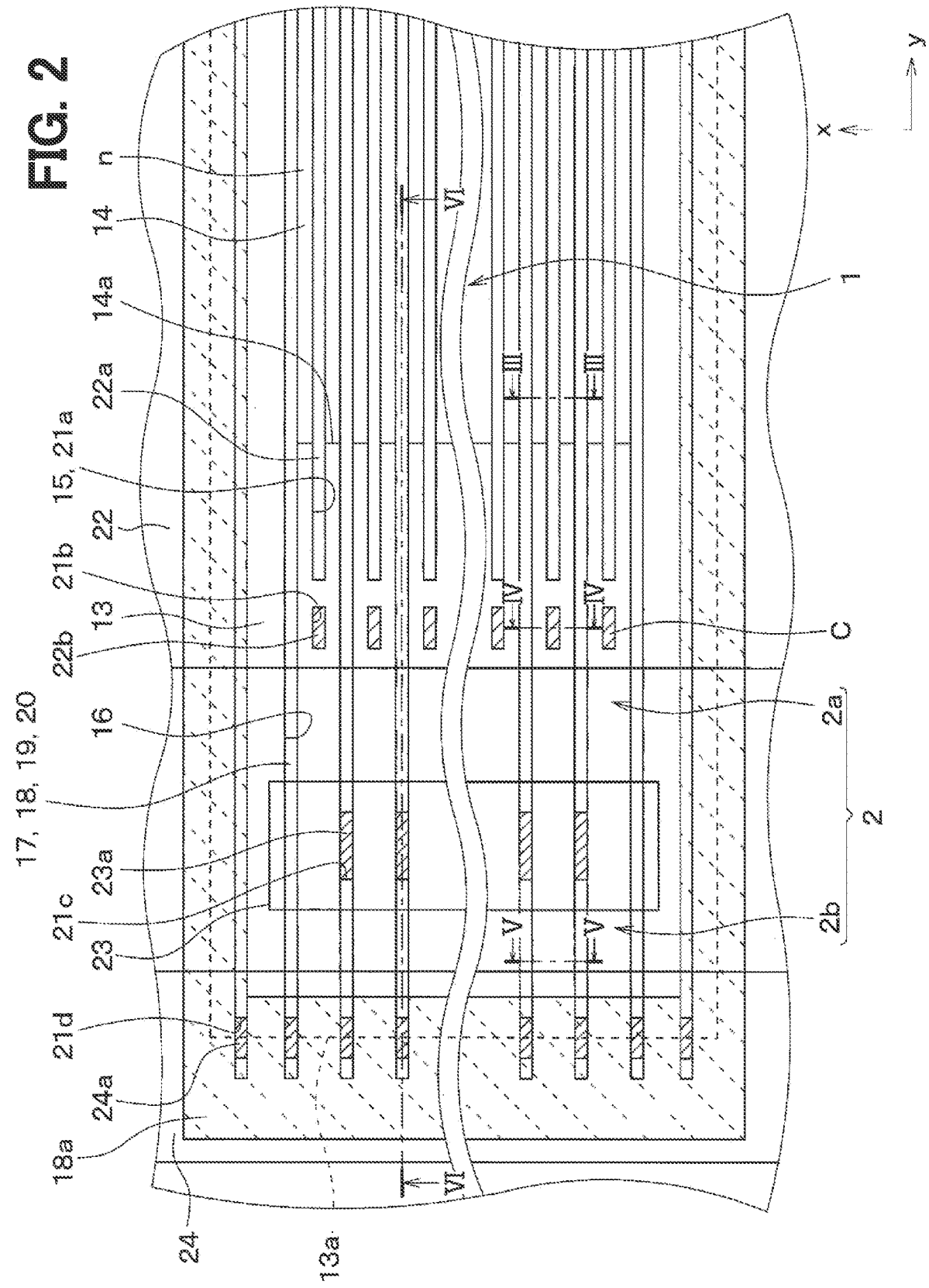
FIG. 2 is an upper surface layout diagram of the semiconductor device according to the first embodiment.

Further, a p-type body region 13 having a relatively low impurity concentration is formed at a certain position in the surface layer portion of the drift layer 12. The body region 13 is formed by, for example, ion-implanting a p-type impurity into the drift layer 12, and also functions as a channel layer for forming a channel region. As shown in FIG. 2, the body region 13 is formed with the y-direction as the longitudinal direction among multiple trench-gate structures described later. As illustrated in FIG. 2, the body region 13 extends from the cell portion 1 to the peripheral portion 2. In FIG. 2, the boundary between a portion where the body region 13 is formed and a portion where the body region 13 is not formed is indicated by a broken line as a body-region boundary portion 13a.

A surface layer portion of the body region 13 is provided with an n-type source region 14 having a higher impurity concentration than the drift layer 12. As shown in FIG. 2, the source region 14 is formed with the y-direction as the longitudinal direction among multiple trench-gate structures described later. The source region 14 is formed to be terminated inside the body region 13. In the present embodiment, a portion where the source region 14 is formed is configured as the cell portion 1. In FIG. 2, the boundary between a portion where the source region 14 is formed and a portion where the source region 14 is not formed is indicated as a source-region boundary portion 14a. In the present embodiment, the body region 13 corresponds to a first impurity region, and the source region 14 corresponds to a second impurity region.

Multiple contact trenches 15 are respectively formed at the semiconductor substrate 10 to penetrate the source region 14 and reach the body region 13. Therefore, the body region 13 is exposed at the bottom surface of the contact trench 15. At the portion of the body region 13 exposed from the contact trench 15, a $p^+$ type contact region 13b for the body region that serves as a contact for the body region is formed. At a portion of the source region 14 exposed from the side surface of the contact trench 15, a contact region 14b for the source region that serves as a contact is formed. In the present embodiment, the contact region 14b for the source region corresponds to a contact region for the second impurity region.

As shown in FIG. 2, the contact trench 15 is formed with the y-direction as the longitudinal direction among multiple trench-gate structures. The contact trench 15 is formed to protrude from the source region 14 in the y-direction. In other words, the contact trench 15 is formed from the cell portion 1 to the peripheral portion 2. However, the contact trench 15 is formed to be terminated inside the body region 13 in the y-direction. The contact trenches 15 are formed to be arranged in the x-direction, and are respectively formed among the trench-gate structures. In other words, the contact trenches 15 are laid out in a stripe shape or a stripe shape arranged in parallel at regular intervals.

Figure 7:
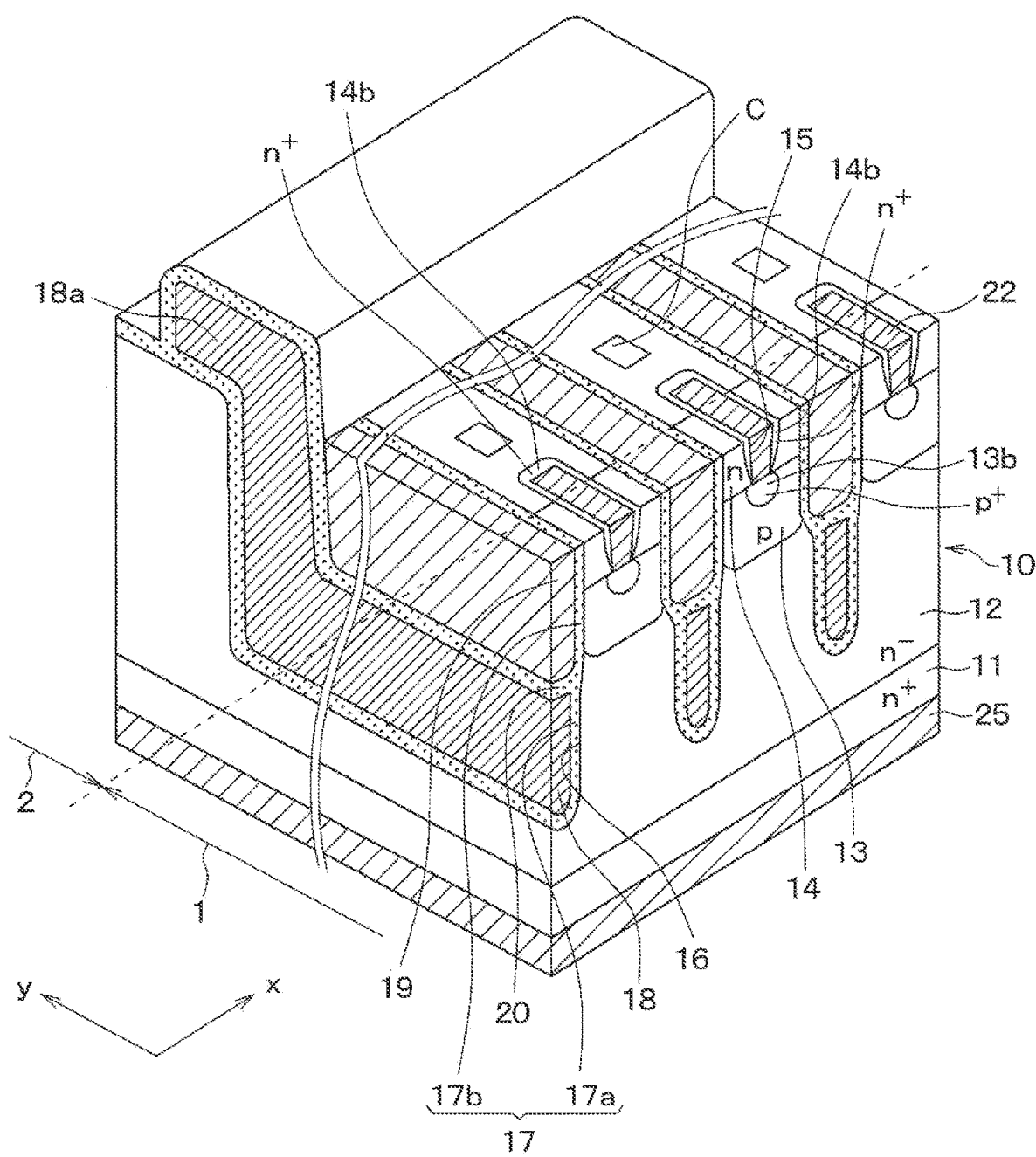
FIG. 7 is a perspective schematic view of the semiconductor device according to the first embodiment.

The contact region 14b for the source region is formed around the contact trench 15 as illustrated in FIG. 7. In other words, the contact region 14b for the source region is formed to surround the contact trench 15 at a first surface 10a of the semiconductor substrate 10. Therefore, in the present embodiment, the contact region 14b for the source region protrudes from the source region 14 in the y-direction. In other words, the contact region 14b for the source region extends to the peripheral portion 2.

Multiple gate trenches 16 arranged in the x-direction and having the y-direction (that is, one direction) as the longitudinal direction are formed between the body region 13 and the source region 14 at the surface layer portion of the drift layer 12. The gate trench 16 is a trench for forming a trench-gate structure, and in the present embodiment, the gate trenches 16 are arranged in parallel at equal intervals to form a layout with a stripe shape.

Each of the gate trenches 16 extends from the cell portion 1 to the peripheral portion 2 in the y-direction. In the present embodiment, the gate trench 16 is formed to protrude from the body region 13 at the peripheral portion 2 as illustrated in FIG. 2. In other words, the body region 13 is terminated inside the gate trench 16 in the extending direction in the y-direction.

The gate trench 16 is formed to be deeper than the body region 13. In other words, the gate trench 16 may be formed to penetrate the source region 14 and the body region 13 from the first surface 10a side of the semiconductor substrate 10 and reach the drift layer 12. Further, in the present embodiment, the width of the gate trench 16 gradually narrows toward the bottom of the gate trench 16, and the bottom of the gate trench 16 is rounded.

Multiple gate trenches 16 are formed such that the gate trenches 16 located at both ends in the x-direction are located at the peripheral portion 2. Therefore, the gate trenches 16 located at both ends in the x-direction are formed to penetrate the body region 13 and reach the drift layer 12.

An inner wall surface of the gate trench 16 is covered with an insulating film 17. The insulating film 17 according to the present embodiment includes a shield insulating film 17a and a gate insulating film 17b. The shield insulating film 17a covers a lower portion of the gate trench 16, and the gate insulating film 17b covers an upper portion of the gate trench 16. The shield insulating film 17a is formed to cover the side surface of the lower portion of the gate trench 16 from the bottom portion of the gate trench 16. The gate insulating film 17b is formed to cover the side surface of the upper portion of the gate trench 16.

Figure 3:
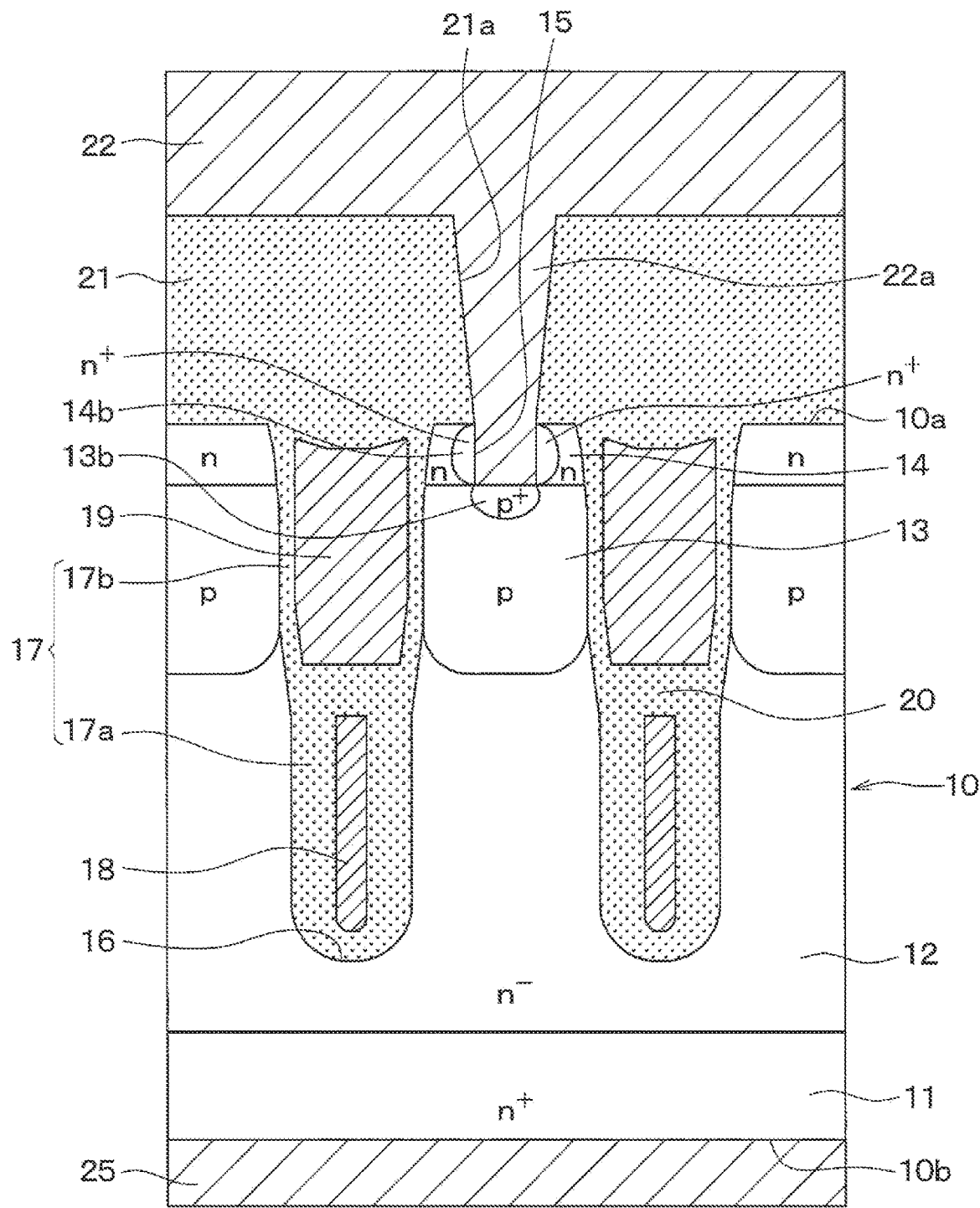
FIG. 3 is a cross-sectional view taken along line III-III shown in FIG. 2.
Figure 4:
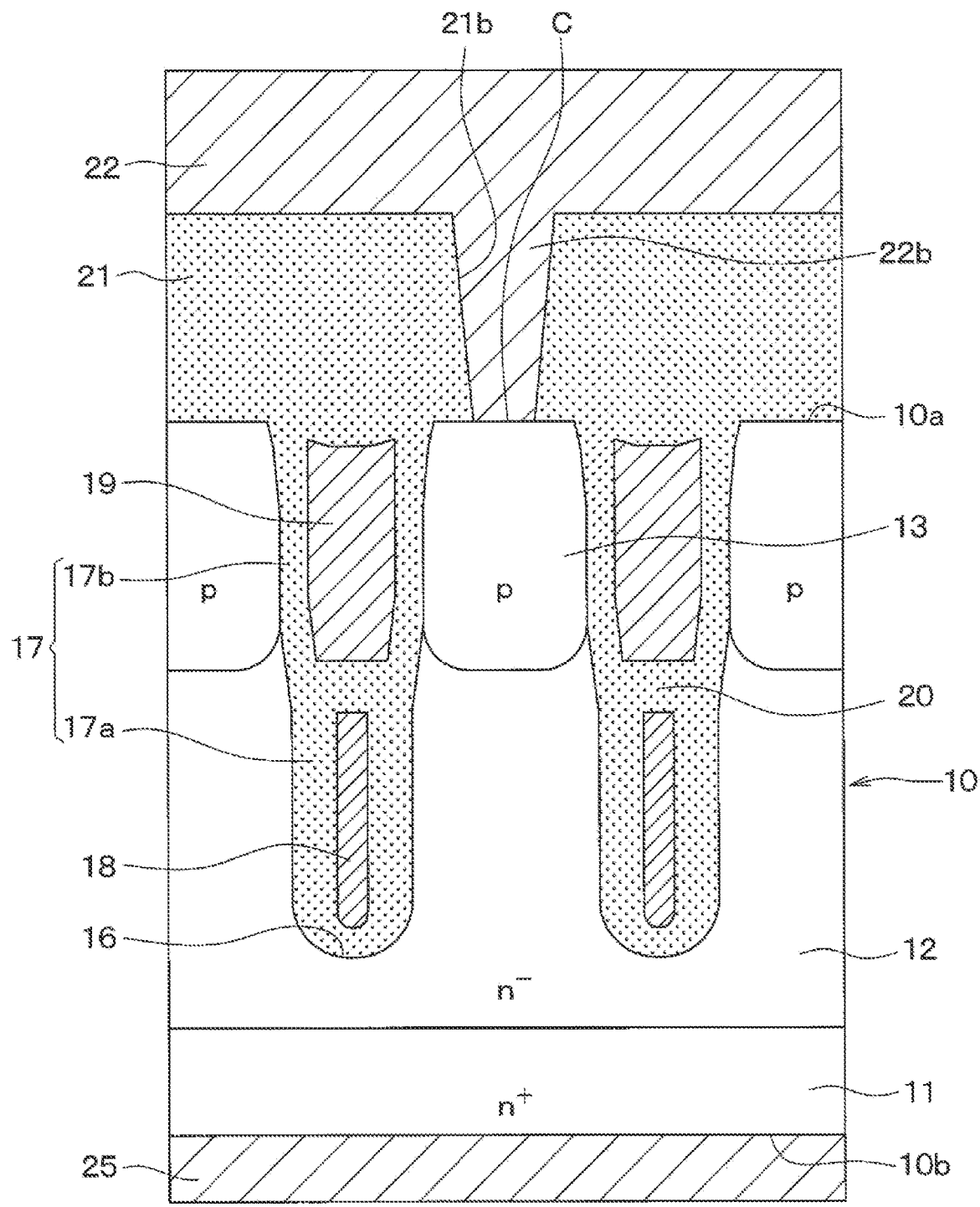
FIG. 4 is a cross-sectional view taken along line IV-IV shown in FIG. 2.
Figure 5:
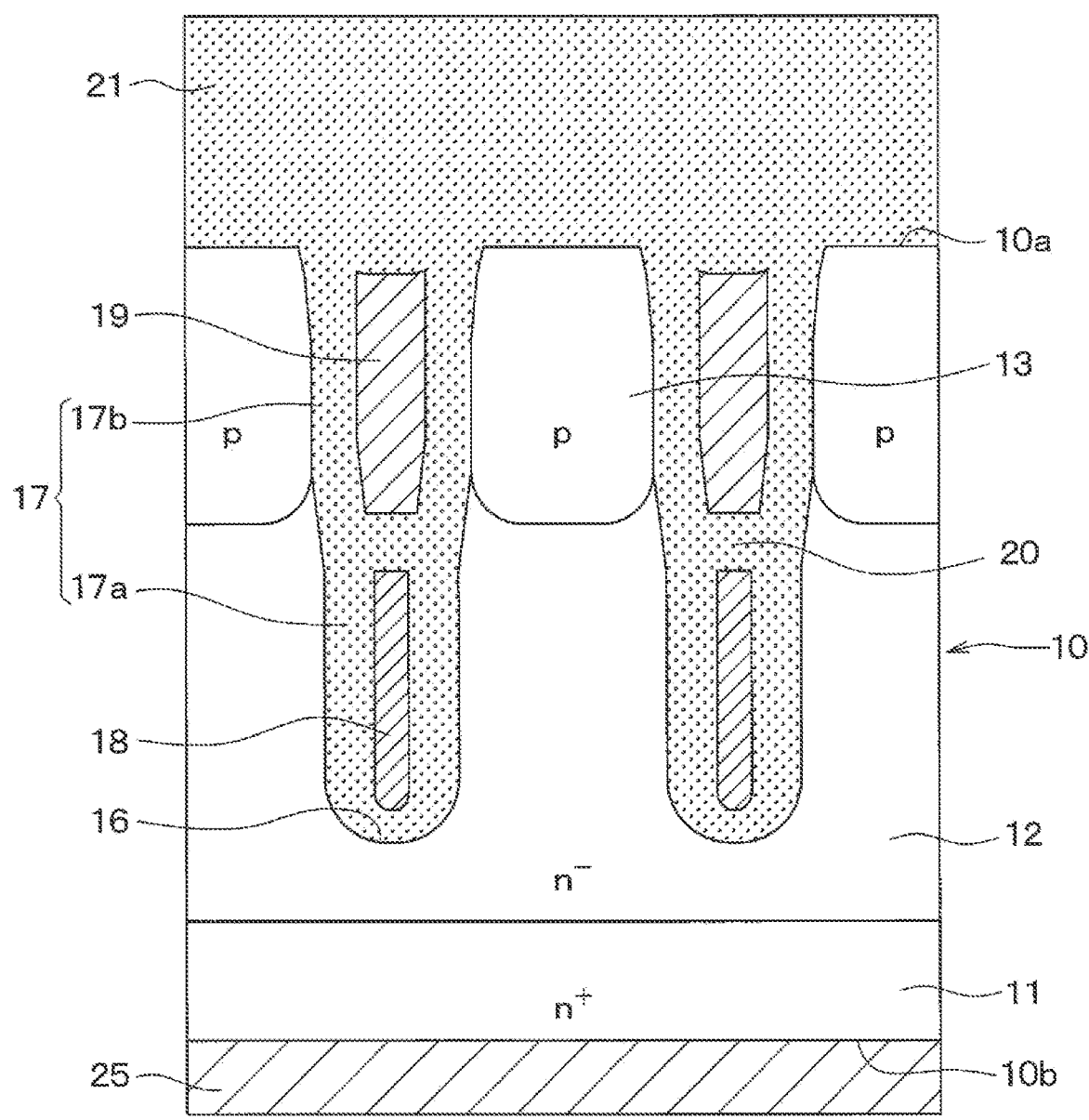
FIG. 5 is a cross-sectional view taken along line V-V shown in FIG. 2.

As illustrated in FIGS. 3 to 5, in the present embodiment, the gate insulating film 17b formed in the peripheral portion 2 is thicker than the gate insulating film 17b formed in the cell portion 1. The peripheral portion 2 has an inner peripheral section 2a and an outer peripheral section 2b. The gate insulating film 17b formed in the outer peripheral section 2b is thicker than the gate insulating film 17b formed in the inner peripheral section 2a. In other words, the thickness of the gate insulating film 17b increases from the cell portion 1, the inner peripheral section 2a of the peripheral portion 2 and the outer peripheral section 2b of the peripheral portion 2.

As illustrated in FIG. 2, in the present embodiment, in a view of a direction normal to the surface of the semiconductor substrate 10, a section of the peripheral portion 2 facing the cell portion 1 from a gate wiring 23 in the y-direction is defined as the inner peripheral section 2a. In a view of a direction normal to the surface of the semiconductor substrate 10, a section of the peripheral portion 2 facing a portion on a side opposite from the cell portion 1 from the gate wiring 23 in the y-direction is defined as the outer peripheral section 2b. In a situation of modifying the thickness of the gate insulating film 17b, the thickness is adjusted by, for example, placing an insulating film on a portion desired to be thickened through, for example, deposition after the formation of the insulating film through thermal oxidation.

A shield electrode 18 and a gate electrode 19 are stacked via the insulating film 17 inside the gate trench 16. The shield electrode 18 and the gate electrode 19 are made of doped Poly-Si. In other words, double gates are arranged inside the gate trench 16.

The shield electrode 18 are fixed to the source potential by connecting to an upper electrode 22. In the semiconductor device according to the present embodiment, it is possible to reduce the capacitance between the gate and the trench while enhancing the electrical characteristics of the MOSFET. The gate electrode 19 performs a switching operation of the vertical MOSFET, and forms a channel region in the body region 13 on the side surface of the gate trench 16 when a gate voltage is applied.

An intermediate insulating film 20 is formed between the shield electrode 18 and the gate electrode 19. Therefore, the shield electrode 18 and the gate electrode 19 are insulated. The gate trench 16, the insulating film 17, the shield electrode 18, the gate electrode 19, and the intermediate insulating film 20 configure a trench-gate structure. The trench-gate structures are formed in a layout with a stripe shape in which the multiple gate trenches 16 are arranged in the x-direction parallel to an up-down direction of the drawing of FIG. 2. The longitudinal direction of the gate trench 16 is in the y-direction parallel to a left-right direction of the drawing of FIG. 2.

The source region 14 is formed at an inner portion of the trench-gate structure in the longitudinal direction, and the cell portion 1 functions as the MOSFET in the inner portion. A tip portion of the trench-gate structure outside the cell portion 1 is located at the peripheral portion 2.

Figure 6:
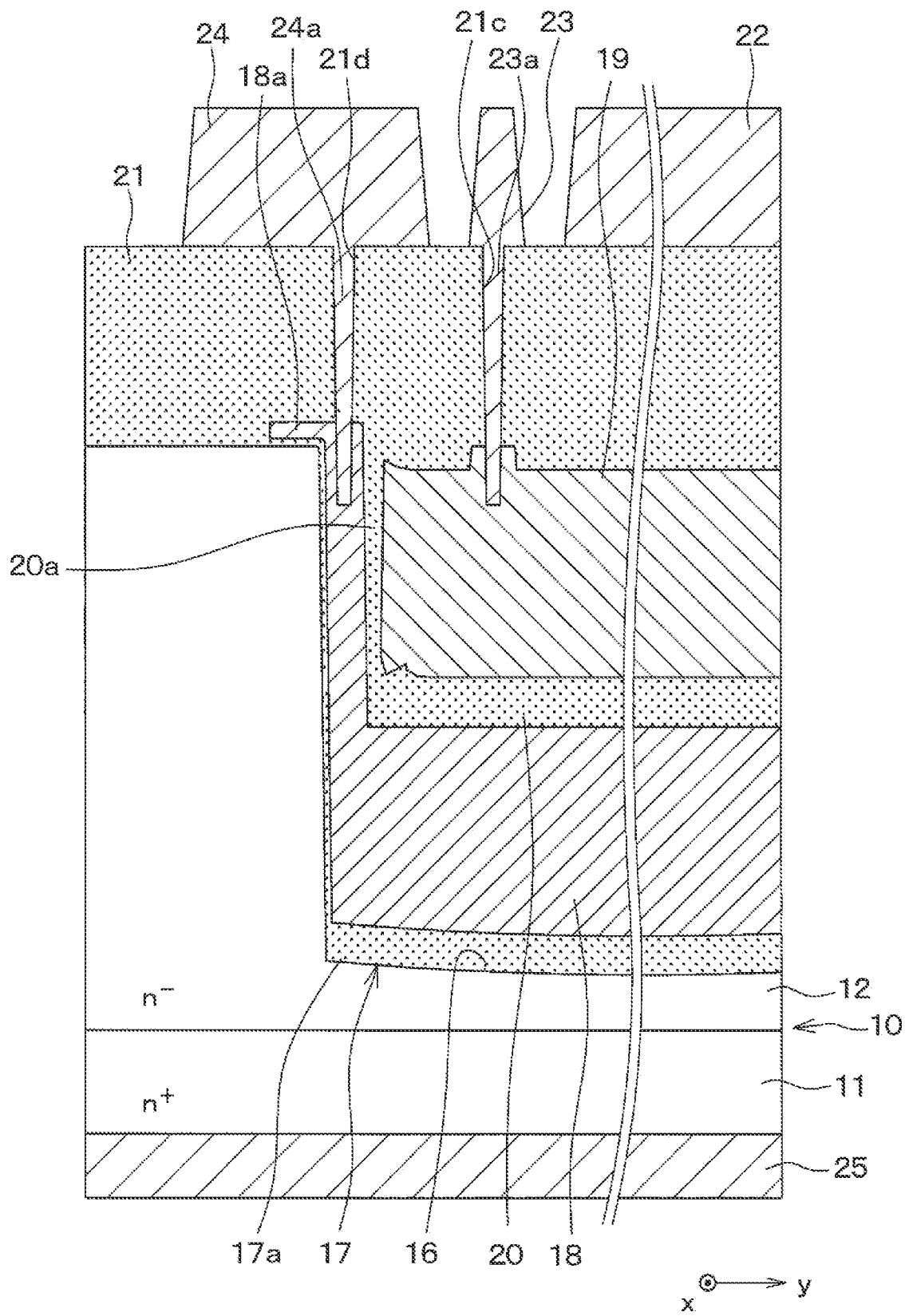
FIG. 6 is a cross-sectional view taken along line VI-VI shown in FIG. 2.

As illustrated in FIG. 6, at the tip portion of the gate trench 16 in the longitudinal direction, the shield electrode 18 extends outward from the gate electrode 19. Then, those portions are exposed from the surface side of the body region 13 and the source region 14 as a shield liner 18a. At the end portion of the gate trench 16 in the longitudinal direction, a portion of the shield electrode 18 extending outward from the gate electrode 19 and the tip of the gate electrode 19 are insulated by a tip portion 20a of the intermediate insulating film 20.

In the present embodiment, the shield liner 18a is routed to surround the cell portion 1. Although FIG. 2 is not a cross-sectional view, the shield liner 18a is hatched for easy understanding. Also in the drawings corresponding to FIG. 2 described later, the shield liner 18a is hatched for easy understanding.

An interlayer insulating film 21 made of, for example, an oxide film for covering the gate electrode 19 is formed at the first surface 10a side of the semiconductor substrate 10. As illustrated in FIG. 3, a first contact hole 21a is formed at the interlayer insulating film 21. The first contact hole 21a communicates with the contact trench 15 formed at the semiconductor substrate 10.

In the present embodiment, the contact trench 15, the contact region 14b for the source region and the contact region 13b for the body region are formed as follows.

After forming the first contact hole 21a at the interlayer insulating film 21, the interlayer insulating film 21 is formed as a mask. The contact region 14b for the source region is formed by thermal diffusion through ion implantation of impurity through the first contact hole 21a. After forming the contact region 14b for the source region, the interlayer insulating film 21 is again formed as the mask. The contact trench 15 is formed to penetrate the contact region 14b for the source region and communicate with the first contact hole 21a. In the present embodiment, the contact region 14b for the source region and the contact trench 15 are formed by adopting the identical mask as the identical interlayer insulating film 21. The contact region 14b for the source region is formed around the contact trench 15.

The interlayer insulating film 21 is again adopted as the mask, and the ion implantation of impurities for forming the contact region 13b for the body region at the bottom surface of the contact trench 15 is performed to form the contact region 13b for the body region. In the present embodiment, the contact trench 15, the contact region 14b for the source region, and the contact region 13b for the body region are formed in this way.

As illustrated in FIG. 4, a second contact hole 21b is formed at the interlayer insulating film 21 in the peripheral portion 2. The second contact hole 21b exposes the surface of the body region 13. As illustrated in FIG. 6, a third contact hole 21c and a fourth contact hole 21d are formed at the interlayer insulating film 21. The third contact hole 21c exposes the gate electrode 19 at the peripheral portion 2, and the fourth contact hole 21d exposes the shield liner 18a at the peripheral portion 2.

The upper electrode 22 corresponds to a source electrode. The upper electrode 22, the gate wiring 23 and a shield wiring 24 are formed on the interlayer insulating film 21. The upper electrode 22 are formed to be electrically connected to the body region 13 (in other words, the contact region 13b for the body region) and the source region 14 (in other words, the contact region 14b for the source region) through a first connecting portion 22a at the cell portion 1, as illustrated in FIGS. 2 and 3. The first connecting portion 22a is made of, for example, a tungsten (W) plug, and is embedded in the first contact hole 21a formed at the interlayer insulating film 21 and the contact trench 15. In the present embodiment, the upper electrode 22 corresponds to a first electrode.

As illustrated in FIG. 4, in the peripheral portion 2, the upper electrode 22 is also connected to the body region 13 through a second connecting portion 22b made of, for example, a tungsten (W) plug embedded in the fourth contact hole 21d formed at the interlayer insulating film 21. A contact portion C connected to the upper electrode 22 is formed at the body region 13 formed at the peripheral portion 2.

As illustrated in FIG. 6, the gate wiring 23 is electrically connected to the gate electrode 19 through a connecting portion 23a such as a tungsten (W) plug in the third contact hole 21c formed at the interlayer insulating film 21. The shield wiring 24 is formed to be electrically connected to the shield electrode 18 through a connecting portion 24a such as a tungsten (W) plug embedded in the fourth contact hole 21d formed at the interlayer insulating film 21. Although FIG. 2 is not a cross-sectional view, for better understanding, a portion of the gate electrode 19 connected to the gate wiring 23 and a portion of the shield electrode 18 connected to the shield wiring 24 are hatched. Also in the drawings corresponding to FIG. 2 described later, the above portions are hatched for better understanding.

Further, a lower electrode 25 corresponding to a drain electrode is formed on a surface of the substrate 11 on a side opposite from the drift layer 12. The lower electrode 25 is formed at a second surface 10b of the semiconductor substrate 10. In the present embodiment, the lower electrode 25 corresponds to a second electrode. The vertical MOSFET in the present embodiment is formed by such a structure.

The structure of the semiconductor device according to the present embodiment has been described above. In the present embodiment, n⁻ type, n-type, and n⁺ type correspond to the first conductivity type, and p-type and p⁺ type correspond to the second conductivity type. In the present embodiment, the semiconductor substrate 10 includes, for example, the substrate 11, the drift layer 12, the body region 13, and the source region 14.

The following describes the operation and advantageous effects of the above-mentioned semiconductor device. In such a semiconductor device, as similar to a MOSFET, when a predetermined voltage or larger is applied to the gate electrode 19, a channel is formed at a portion of the body region 13 in contact with the gate trench 16, and the semiconductor is turned to an on-state as the current flows between the source and the drain. When the voltage applied to the gate electrode 19 becomes smaller than the predetermined voltage, the channel formed at the body region 13 disappears, and the semiconductor device is turned to an off-state as the current is cut off.

In such a semiconductor device as described above, the drift layer 12, the body region 13 and the source region 14 form a parasitic bipolar transistor. In such a semiconductor device as described above, when the on-state is turned to the off-state, an excessive amount of current may flow between the source and the drain through the operation of the parasitic bipolar transistor caused by the avalanche operation.

In the semiconductor device according to the present embodiment, the body region 13 extends to the peripheral portion 2. In the peripheral portion 2, the body region 13 has the contact portion C electrically connected to the upper electrode 22. The upper electrode 22 is connected to the contact portion C of the body region 13 in the peripheral portion 2. When the semiconductor device has the avalanche operation, holes are easily extracted from the upper electrode 22 through the contact portion C in the peripheral portion 2. Therefore, it is possible to inhibit the operation of the parasitic bipolar transistor, and it is possible to enhance the breakdown voltage of the semiconductor device by enhancing the avalanche resistance.

In the present embodiment, the contact trench 15 and the contact region 14b for the source region are formed to the peripheral portion 2. As a result, when the semiconductor device has the avalanche operation, it is possible to extract the holes generated at the peripheral portion 2 from the contact trench 15 formed up to the peripheral portion 2. Therefore, it is possible to inhibit the operation of the parasitic bipolar transistor while enhancing the avalanche resistance.

It may also be considered that the avalanche resistance is enhanced without the formation of the contact portion C, by enlarging the protruding length of the contact trench 15 to the peripheral portion 2. For example, the contact trench 15 may protrude to a portion in the vicinity of a location where the contact portion C according to the present embodiment is supposed to be formed.

In the present embodiment, when the contact region 14b for the source region is formed, the mask used for the contact region 14b for the source region and the mask used for the contact trench 15 in the present embodiment are identical. The contact region 14b for the source region is formed around the contact trench 15. When the length of the contact trench 15 protruding to the peripheral portion 2 is increased, the length of the contact region 14b for the source region also becomes longer.

Figure 8:
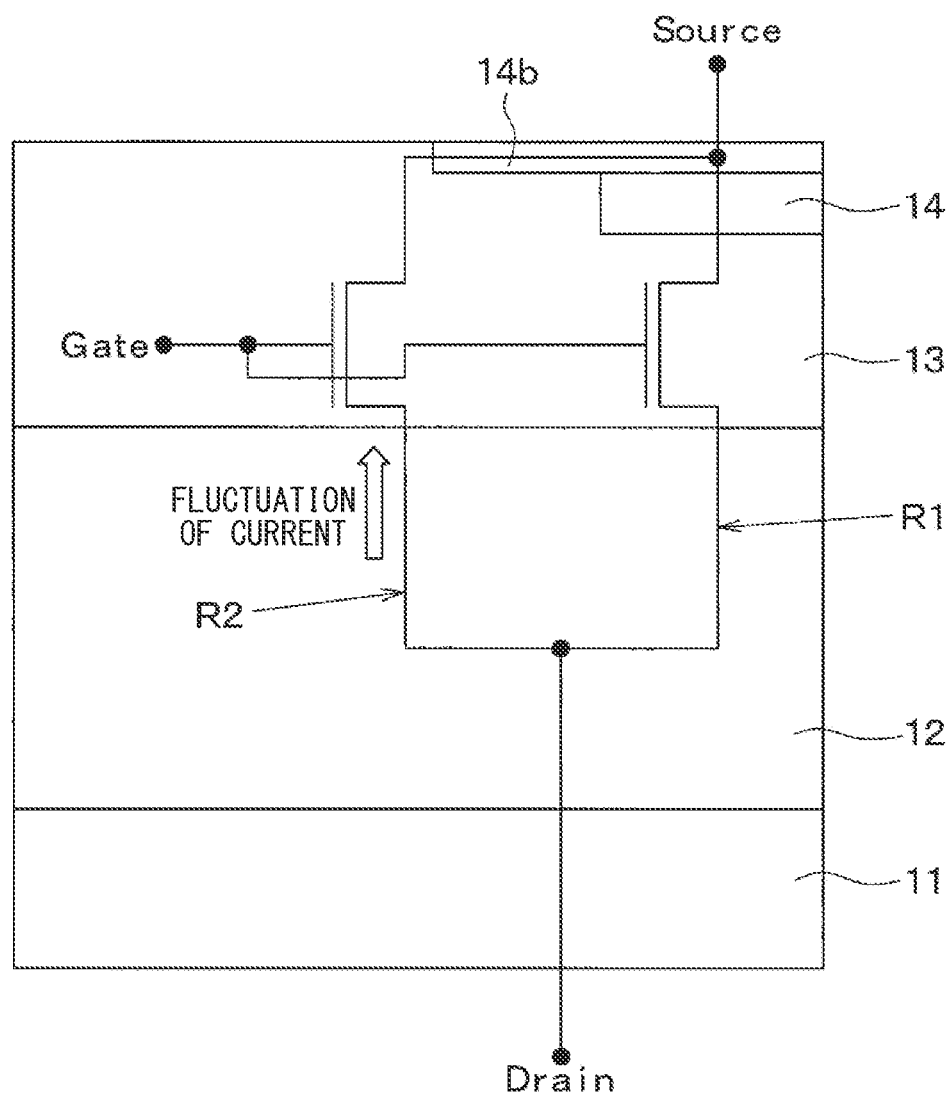
FIG. 8 is a schematic view of a current path when the semiconductor device is in an on-state.

When the semiconductor device is in the on-state, the current flows between the source and the drain. As illustrated in FIG. 8, the current flows through a main path R1 in an order of the substrate 11, the drift layer 12, the body region 13, the source region 14 and the contact region 14b for the source region. The current flows through a parasitic path R2 in an order of the drift layer 12, the body region and the contact region 14b for the source region. The main path R1 is the current that flows only through the cell portion 1, and the parasitic path R2 is the current that flows through the peripheral portion 2. When the length of the contact region 14b for the source region protruding to the peripheral portion 2 is increased, the current flowing in the parasitic path R2 increases, and the current flowing through the main path R1 decreases.

The area of the sense cell region Rs is infinitesimal as compared to the area of the main cell region Rm. As compared with the main cell region Rm, the fluctuation of the current caused by an increase in the current of the parasitic path R2 cannot be neglected. As in the present embodiment, by connecting the body region 13 and the upper electrode 22 at the peripheral portion 2, it is possible to inhibit a decrease in the current flowing through the cell portion 1 while enhancing the avalanche resistance. In other words, it is possible to inhibit a decrease in the current flowing through the sense cell region Rs of the cell portion 1 while enhancing the avalanche resistance. Therefore, it is possible to enhance the avalanche resistance while inhibiting a decrease in the precision of detecting the current in the semiconductor device in the present embodiment.

In the above semiconductor device, the gate insulating film 17b in the peripheral portion 2 is thicker than the gate insulating film 17b in the cell portion 1. In other words, the gate insulating film 17b in the peripheral portion 2 on a longitudinal end side where the concentration of electrical field tends to occur at the operation of the avalanche operation is thickened. Therefore, it is possible to inhibit the breakdown of the gate insulating film 17b, and is possible to further enhance the avalanche resistance.

According to the present embodiment described above, the body region 13 extends to the peripheral portion 2. In the peripheral portion 2, the body region 13 has the contact portion C electrically connected to the upper electrode 22. When the semiconductor device has the avalanche operation, holes are easily extracted from the upper electrode 22 through the contact portion C in the peripheral portion 2. Therefore, it is possible to inhibit the operation of the parasitic bipolar transistor, and it is possible to enhance the breakdown voltage of the semiconductor device by enhancing the avalanche resistance.

By connecting the body region 13 and the upper electrode 22 at the peripheral portion 2, it is possible to inhibit a decrease in the current flowing through the cell portion 1 while enhancing the avalanche resistance, as compared with a case in which the protruding length of the contact trench 15 to the peripheral portion 2 is made larger. In this case, it is possible to decrease the reduction ratio of the current flowing through the sense cell region Rs.

In the present embodiment, the gate insulating film 17b in the peripheral portion 2 is thicker than the gate insulating film 17b in the cell portion 1. In other words, the gate insulating film 17b in the peripheral portion 2 on a longitudinal end side where the concentration of electrical field tends to occur at the operation of the avalanche operation is thickened. Therefore, it is possible to inhibit the breakdown of the gate insulating film 17b, and is possible to further enhance the avalanche resistance.

OTHER EMBODIMENTS

Although the present disclosure has been described in accordance with the embodiments, it is understood that the present disclosure is not limited to such embodiments or structures. The present disclosure encompasses various modifications and variations within the scope of equivalents. In addition, while the various elements are shown in various combinations and configurations, which are exemplary, other combinations and configurations, including more, less or only a single element, are also within the spirit and scope of the present disclosure.

In the first embodiment described above, the MOSFET of the n-channel trench-gate structure in which the first conductivity type is n-type and the second conductivity type is p-type has been described as an example of the semiconductor device. However, this is merely an example, and a semiconductor device of another structure, for example, a MOSFET of a trench-gate structure of a p-channel type in which the conductivity type of each component is inverted with respect to the n-channel type may also be used. Other than the MOSFET, the semiconductor device may be formed with an IGBT with a similar structure. In the case of IGBT, the $n^+$ type substrate 11 in the first embodiment is modified to the $p^+$ type collector layer. Other than that, IGBT is similar to the MOSFET as described in the first embodiment.

In the first embodiment, the thickness of the gate insulating film 17b in the cell portion 1 and the thickness of the gate insulating film 17b in the peripheral portion 2 may be identical.

What is claimed is:

1. A semiconductor device comprising:
a cell portion having a semiconductor element; and
a peripheral portion surrounding the cell portion, wherein the semiconductor element in the cell portion includes:
   a drift layer being a first conductivity type;
   a first impurity region located on the drift layer and being a second conductivity type;
   a second impurity region located at a surface layer portion of the first impurity region inside the first impurity region, the second impurity region being the first conductivity type and having a higher impurity concentration than the drift layer;
   a plurality of trench-gate structures arranged in a stripe shape, each of the plurality of trench-gate structures including a gate trench, a shield electrode, an intermediate insulating film, a gate electrode, and an insulating film, the gate trench having one direction as a longitudinal direction of the gate trench while penetrating the first impurity region from the second impurity region and reaching the drift layer, each of the plurality of trench-gate structures configured to have double gates by stacking the shield electrode, the intermediate insulating film and the gate electrode in order via the insulating film in the gate trench;
   a high-concentration layer being the first conductivity type or the second conductivity type, the high-concentration layer located on a side opposite from the first impurity region with the drift layer sandwiched between the first impurity region and the high-concentration layer;
   an interlayer insulating film located on each of the plurality of trench-gate structures, the first impurity region and the second impurity region, the interlayer insulating film having a first contact hole communicating with the first impurity region and the second impurity region;
   a first electrode electrically connected to the first impurity region and the second impurity region through the first contact hole; and
   a second electrode electrically connected to the high-concentration layer,
the first impurity region extends from the cell portion to the peripheral portion,
the peripheral portion has a section facing the cell portion in the one direction,
the interlayer insulating film further has a second contact hole at the section of the peripheral portion,
the second contact hole exposes the first impurity region, and
the first electrode is electrically connected to the first impurity region through the second contact hole in the peripheral portion.

2. The semiconductor device according to claim 1, wherein
the semiconductor element in the cell portion further includes:
   a contact trench located between adjacent two of the plurality of trench-gate structures, the contact trench having the one direction as a longitudinal direction of the contact trench, the contact trench extending from the cell portion to the peripheral portion while penetrating the second impurity region and reaching the first impurity region; and a contact region configured for the second impurity region, the contact region located around the contact trench and located along a wall surface of the contact trench, the contact region having a higher impurity concentration than the second impurity region, and the first contact hole of the interlayer insulating film communicates with the contact trench.

3. The semiconductor device according to claim 1, wherein the insulating film includes a gate insulating film located between the gate trench and the gate electrode, the gate insulating film has a first part located at the peripheral portion and a second part located at the cell portion, and the first part has a larger thickness than the second part.

4. The semiconductor device according to claim 1, wherein the cell portion includes a main cell region and a sense cell region, the main cell region has a structure identical to the sense cell region, and the sense cell region is configured to enable a flow of a smaller current than the main cell region.

\* \* \* \* \*